United States Patent [19]

Pilling et al.

[11] Patent Number: 5,260,902
[45] Date of Patent: Nov. 9, 1993

[54] EFFICIENT REDUNDANCY METHOD FOR RAM CIRCUIT

[75] Inventors: David J. Pilling, Los Altos Hills; Michael A. Ang, Santa Clara; Scott Revak, Castro Valley, all of Calif.

[73] Assignee: Integrated Device Technology, Inc., Santa Clara, Calif.

[21] Appl. No.: 707,476

[22] Filed: May 30, 1991

[51] Int. Cl.$^5$ ............................................. G11C 7/00
[52] U.S. Cl. ............................ 365/189.02; 365/225.7
[58] Field of Search ............... 365/96, 189.02, 210, 365/225.7; 307/202.1; 371/10.2, 10.3

[56] References Cited

U.S. PATENT DOCUMENTS 4,601,019  7/1986  Shah et al. ........................ 365/200

OTHER PUBLICATIONS

Atsushi Ohba et al., "A 7-ns 1-Mb BiCMOS ECL SRAM with Shift Redundancy", IEEE Journal of Solid State Circuits, vol. 26, No. 24, Apr. 1991, pp. 507-511.

Primary Examiner—Steven Mottola
Attorney, Agent, or Firm—Skjerven, Morrill, MacPherson, Franklin & Friel

[57] ABSTRACT

A redundancy system for a random access memory circuit includes a plurality of groups, each having first and second multiplexers on opposite sides thereof, each group being made up of two squads each containing four columns. Pairs of columns from one group are interlaced with pairs of columns of the other group.

6 Claims, 7 Drawing Sheets

EFFICIENT REDUNDANCY METHOD FOR RAM CIRCUIT

FIELD OF THE INVENTION

This invention relates to a redundancy system for a random access memory circuit, and more particularly, to such a redundancy system associated with squads of columns of the random access memory circuit.

BACKGROUND OF THE INVENTION

It is well known to provide extra columns in a DRAM device so that in the event of failure of a memory cell in a column, that column can be deleted from operation and in effect replaced by an operative (redundant) column.

One approach for implementing such a system is what is called "shift redundancy", which is described in the IEEE Journal of Solid-State Circuits Article, Volume 26, No. 4, April 1991, entitled "A 7-ns 1Mb BiCMOS ECL SRAM with Shift Redundancy", by Ohba et al. Reference is made to FIG. 1 herein for a description of a typical circuit embodying shift redundancy. In that circuit, data is obtained from each memory cell in a column through a bit line pair (B0 $\overline{B0}$, B1 $\overline{B1}$, B2 $\overline{B2}$, B3 $\overline{B3}$, B4 $\overline{B4}$, B5 $\overline{B5}$). This data passes through respective sense amplifiers 20, 22, 24, 26, 28, 30 and multiplexers 32, 34, 36, 38, 40, 42 to data output lines D0-D5. Further included is a redundant column pair containing bit line BRED $\overline{BRED}$. With each of the bit line pairs B0 $\overline{B0}$-B5 $\overline{B5}$ operating, all fuses F1-F7 in line 14 are intact (unblown), so that VCC applied to both the fuse F7 and the fuse F1 insures that low signals are applied by inverters 46-56 to the control terminals of the multiplexers 32-42. This provides the appropriate signal from the bit line pair to the data output line of the associated multiplexer. That is, bit line pair B0 $\overline{B0}$ provides a signal on data output line D0, bit line pair B1 $\overline{B1}$ provides a signal on date output line D1 and so forth.

In the event that, for example, the column including bit line pair B2 $\overline{B2}$ is defective, and it is desired to bring in BRED and $\overline{BRED}$, fuse F3 is blown, as is fuse F7, tying the line 44 rightward of fuse F3 to ground. The inverters 50-56 associated with multiplexers 36, 38, 40, 42 then provide a high signal at the control terminals of those multiplexers 36-42, so that the input signal provided to terminal B of each of the multiplexers 36-42 is provided at the data output line of that multiplexer. Thus, the column containing bit line pair B2 $\overline{B2}$ is excluded, while the data associated with bit line pair B3 $\overline{B3}$ is provided to multiplexer 36 and to data output D2. Likewise, the data associated with bit line pair B4 $\overline{B4}$ is applied to multiplexer 38 and data output line D3, and so forth, bringing BRED $\overline{BRED}$ into the array.

While such a system has in the past been relatively effective in use, as dimensions of parts become internally smaller, it is becoming more common that a defect falls on adjacent columns, i.e., rendering at least two adjacent columns inoperative. It will be seen that the above-described system is not capable of dealing with such a problem.

Another type of system for replacing a defective column in a memory device is decode redundancy. An example of such a system is shown in FIG. 2. Redundant bit lines B, $\overline{B}$ are shown therein. Assuming, for example, that the address line $\overline{A5}$ A6 $\overline{A7}$ . A8 previously addressed a defective memory cell in a column, and that defective column is then excluded by blowing an appropriate fuse, it is now desirable to incorporate the bit line pair B $\overline{B}$ in its place, to be addressed by that address line, $\overline{A5}$ A6 $\overline{A7}$ . A8. In that case, fuse 70 would be blown, so that the transistor pair 72 is no longer tied to ground. Furthermore, fuses 74, 76, 78 would be blown. In addition, fuses 80, 82, 84 of stage 99 would be blown (fuse 86 being left intact), while fuses 88, 90 would be blown (leaving fuses 92, 94 intact). This connects up the input line $\overline{A5}$ A6 $\overline{A7}$ . A8 through the stage 99 to the bit line pair B $\overline{B}$.

While this system allows replacement of any defective column anywhere in a memory array, a main disadvantage is that a very large number of fuses must be blown, and a price is paid in speed performance.

SUMMARY OF THE INVENTION

Broadly stated, the present memory device includes a first multiplexer having a first pair of columns and a second pair of columns each connected thereto and extending therefrom, and a second multiplexer having a third pair of columns and a fourth pair of columns, each connected thereto and extending therefrom. The third pair of columns extends between the first and second pairs of columns, while the third pair of columns extends between the second and fourth pairs of columns.

DESCRIPTION OF THE PREFERRED EMBODIMENT

Figure 3:
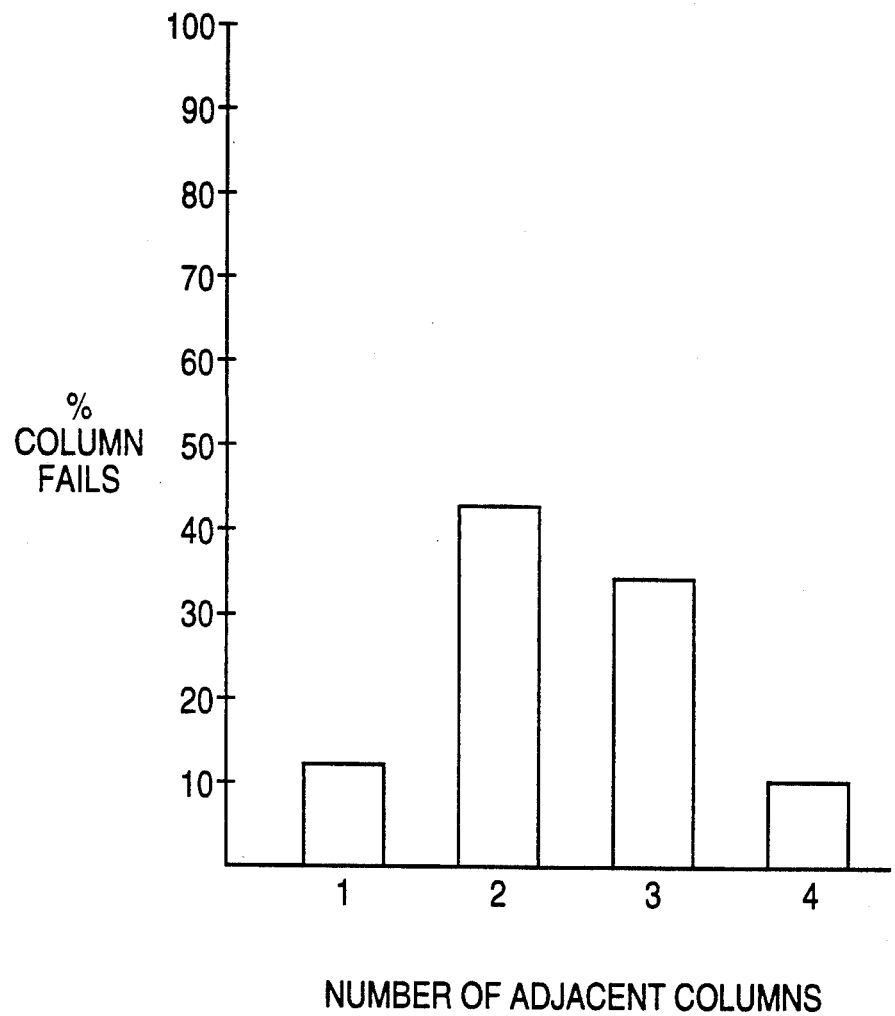
FIG. 3 is a graphical view showing a percentage of column failures as a function of number of adjacent columns failed in typical present-day memory devices.

It is known to provide what is called a squad of memory columns which is replaced by another squad of memory columns in the event of failure of one or more columns within the original squad. Such a system is used both in shift and decode redundancy as described above. Since memory cells have shrunk dramatically in size over recent time, it is more and more likely that a defect will cover more than one column. This distribution of failures in a recent study is shown in FIG. 3. That is, for a given defect, for example, more than 40% of the time, two adjacent columns will fail, and more than 30% of the time, three adjacent columns will fail. This leads to the use of replacement squads to increase the likelihood that the replacement will, in fact, be effective.

Figure 4A:
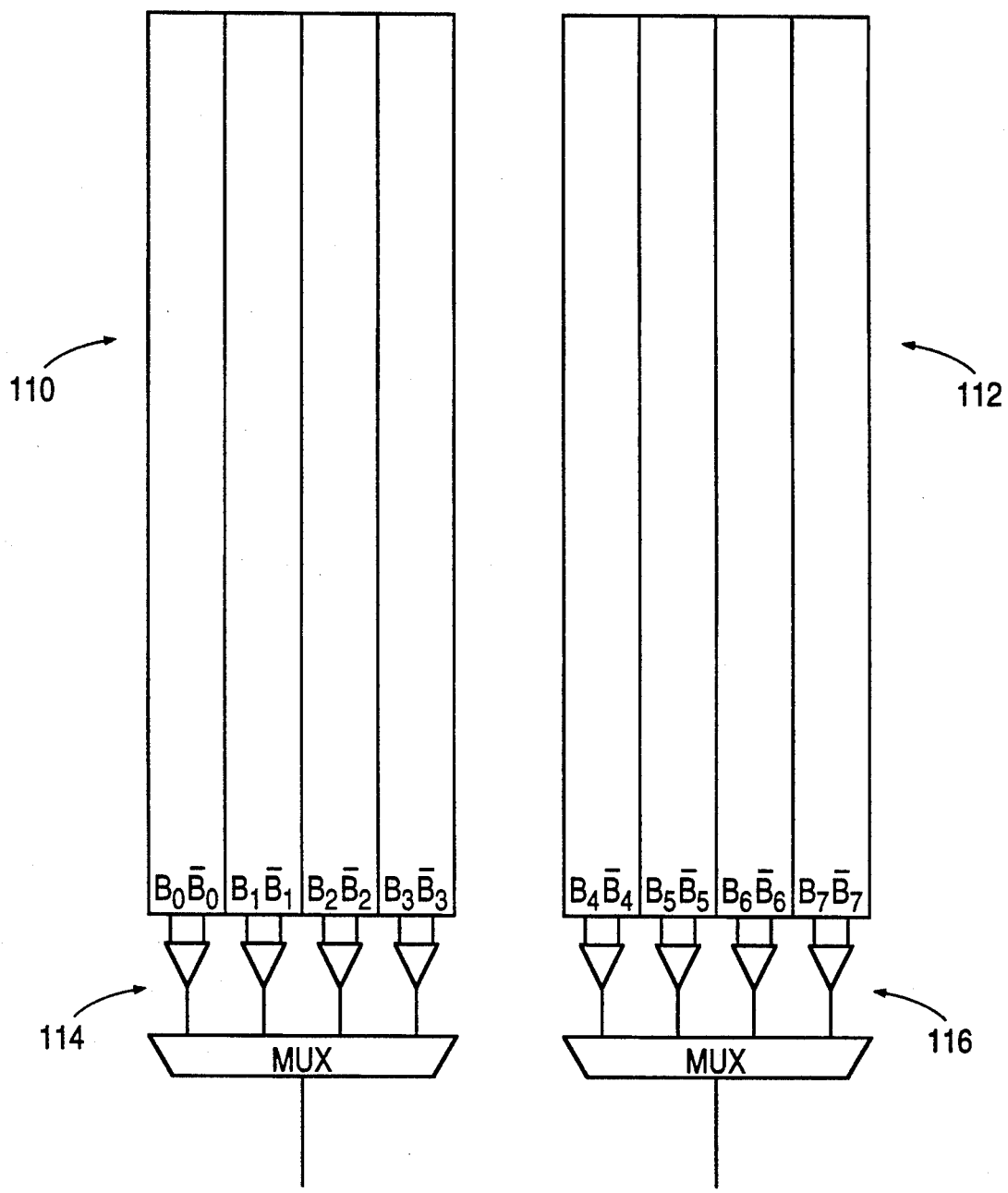
FIG. 4a shows a memory system with two single-sided squads of four columns each.

FIG. 4a shows two single sided squads 110, 112 of four columns each for use in shift redundancy. The term "single sided" is used because the multiplexer/sense amplifier circuitry 114, 116 of each squad is placed on one side of that squad. Because of the nature of shift redundancy described above, if adjacent columns in different squads fail, this system is not capable of repair. That is, in the column containing bit lines B3 $\overline{B3}$ and the column containing bit lines B4 $\overline{B4}$ fail (due for example to a single defect), the operative squad to the right of squad 112 can replace squad 112, but the squad 112 to the right of squad 110 is not fully operative and cannot replace squad 110.

Figure 4B:
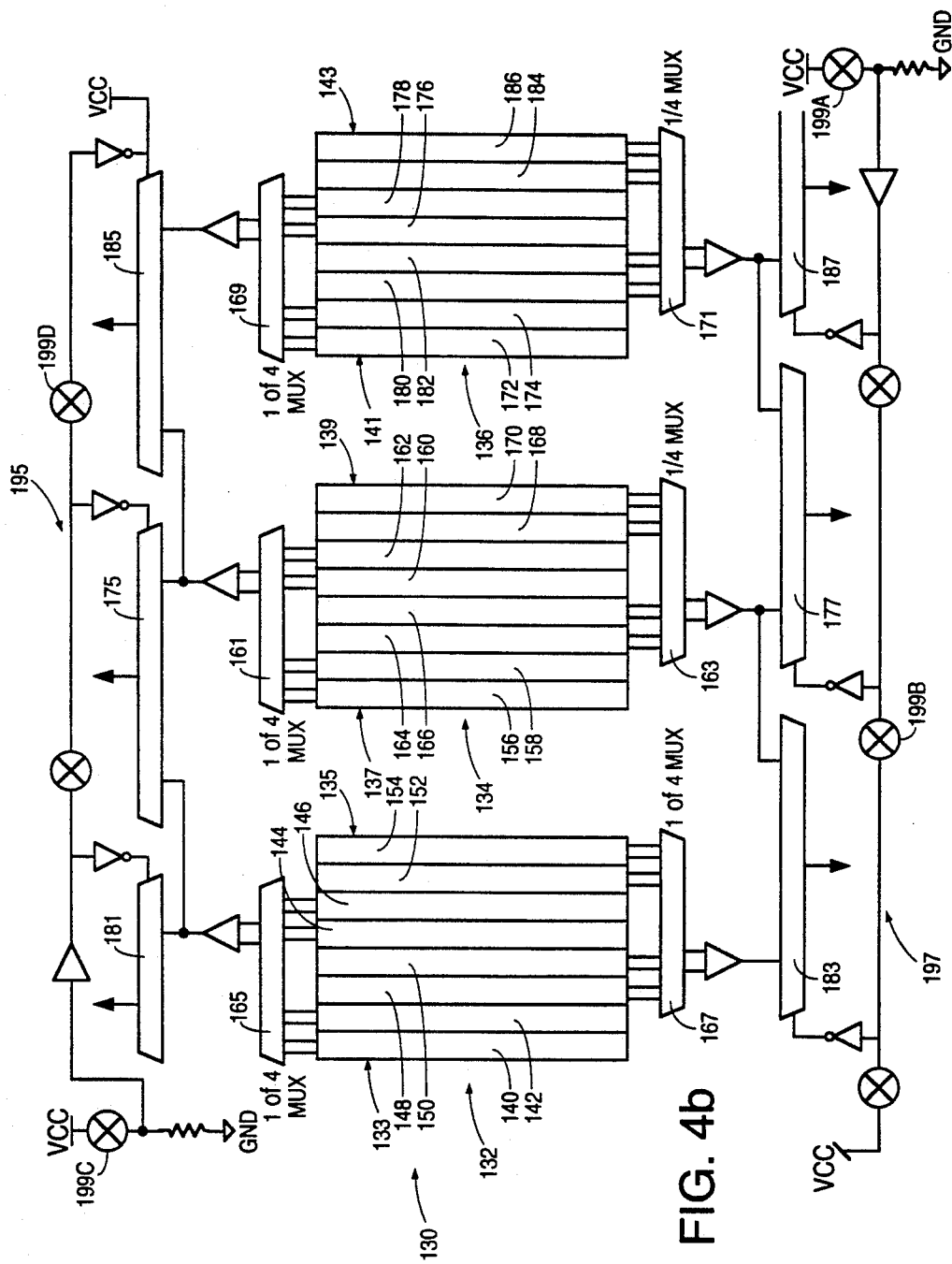
FIG. 4b shows an embodiment of the present invention, with two squads of four columns each, interleaved and forming a double-sided group of squads.

Referring now to FIG. 4b, the device 130 includes groups 132, 134, 136. Group 132 is made up of two squads 133, 135. Squad 133 contains columns 140, 142, 144, 146, and squad 135 contains columns 148, 150, 152, 154. Similarly, group 134 is made up of squads 137, 139, squad 137 including columns 156, 158, 160, 162, while squad 139 includes columns 164, 166, 168, 170. Finally, group 136 is made up of squads 141, 143, squad 141 including columns 172, 174, 176, 178, While squad 143 contains columns 180, 182, 184, 186. As noted, each of the groups 132, 134, 136 is laid out similarly, and as an example, in group 134 the pair of columns 156, 158 and the pair of columns 160, 162 are operatively associated with the multiplexer 161 and extend therefrom, while the pair of columns 164, 166 and the pair of columns 168, 170 are operatively associated with the multiplexer 163 and extend therefrom, the multiplexers 161, 163 being on opposite sides of the group 134. The pair of columns 164, 166 is positioned between the pair of columns 156, 158 and the pair of columns 160, 162, while the pair of columns 160, 162 is positioned between the pair of columns 164, 166 and the pair of columns 168, 170.

As noted above, group 132 is similarly configured, operatively associated with multiplexers 165, 167 on opposite sides thereof, and group 136 is similarly configured, operatively associated with multiplexers 169, 171 on opposite sides thereof.

Figure 1:
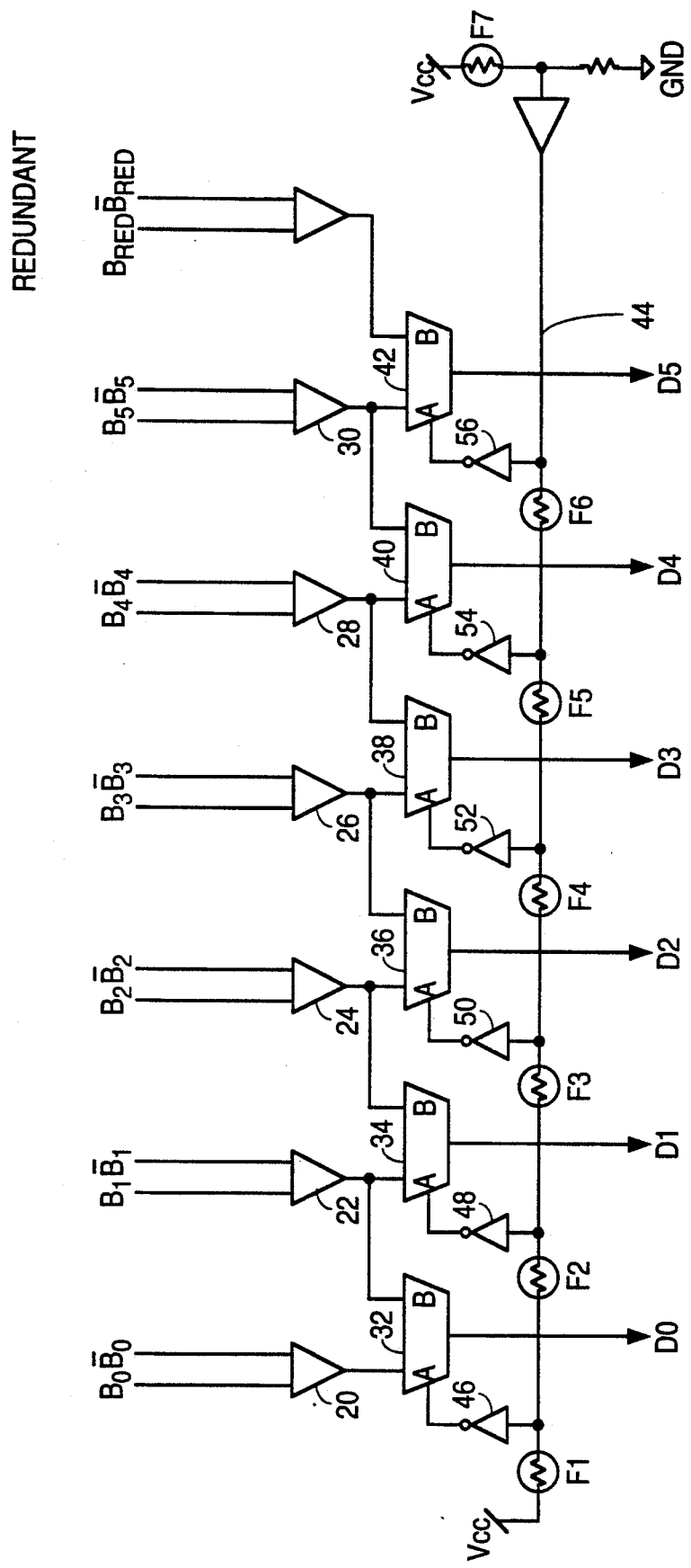
FIG. 1 is a schematic of a prior art memory circuit incorporating a shift redundancy system.
Figure 2:
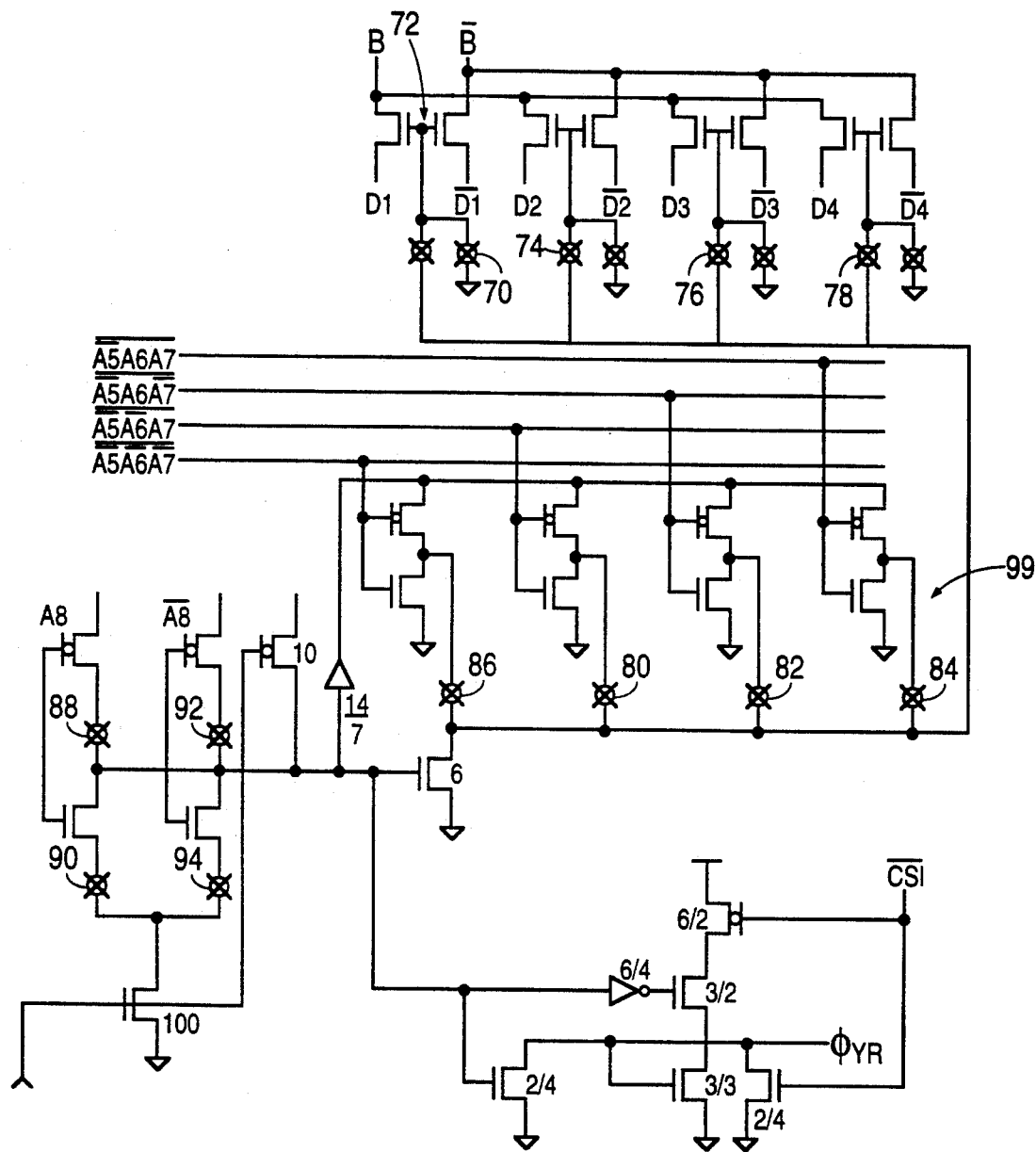
FIG. 2 is a schematic of a prior art memory circuit showing a decode redundancy system.

The array of FIG. 4b includes multiplexers 175, 177, 181, 183, 185, 187 connected as shown, and circuitry 195, 197 on opposite sides thereof similar to that in regard to prior art FIG. 1, describing and showing shift redundancy.

It will be understood that further similarly configured groups can be positioned to the right of group 136, while further similar configured groups can be positioned to the left of group 132.

As an example of the flexibility in use of the device 130 of FIG. 4b, assuming there is a defect which captures both column 158 and column 164 of group 134, the squad 139 containing column 164 can be replaced through redundancy shifting by blowing the fuse 199a and the fuse 199b, removing squad 139 from operative association with the multiplexer 177, and bringing the squad 143 of the group 136 into operative connection with the multiplexer 177, and similarly the fuse 199c and fuse 199d can be blown, removing the squad 137 from operative connection with the multiplexer 175 and bringing the squad 133 of the group 132 into operative association with the multiplexer 175. Thus, it will be seen that in those situations where a defect captures columns from adjacent squads of a group, redundancy shifting can take place from both sides of that group, which would not be possible without the particular positioning and layout of pairs of columns making up a squad.

Figures 5A, 5B:
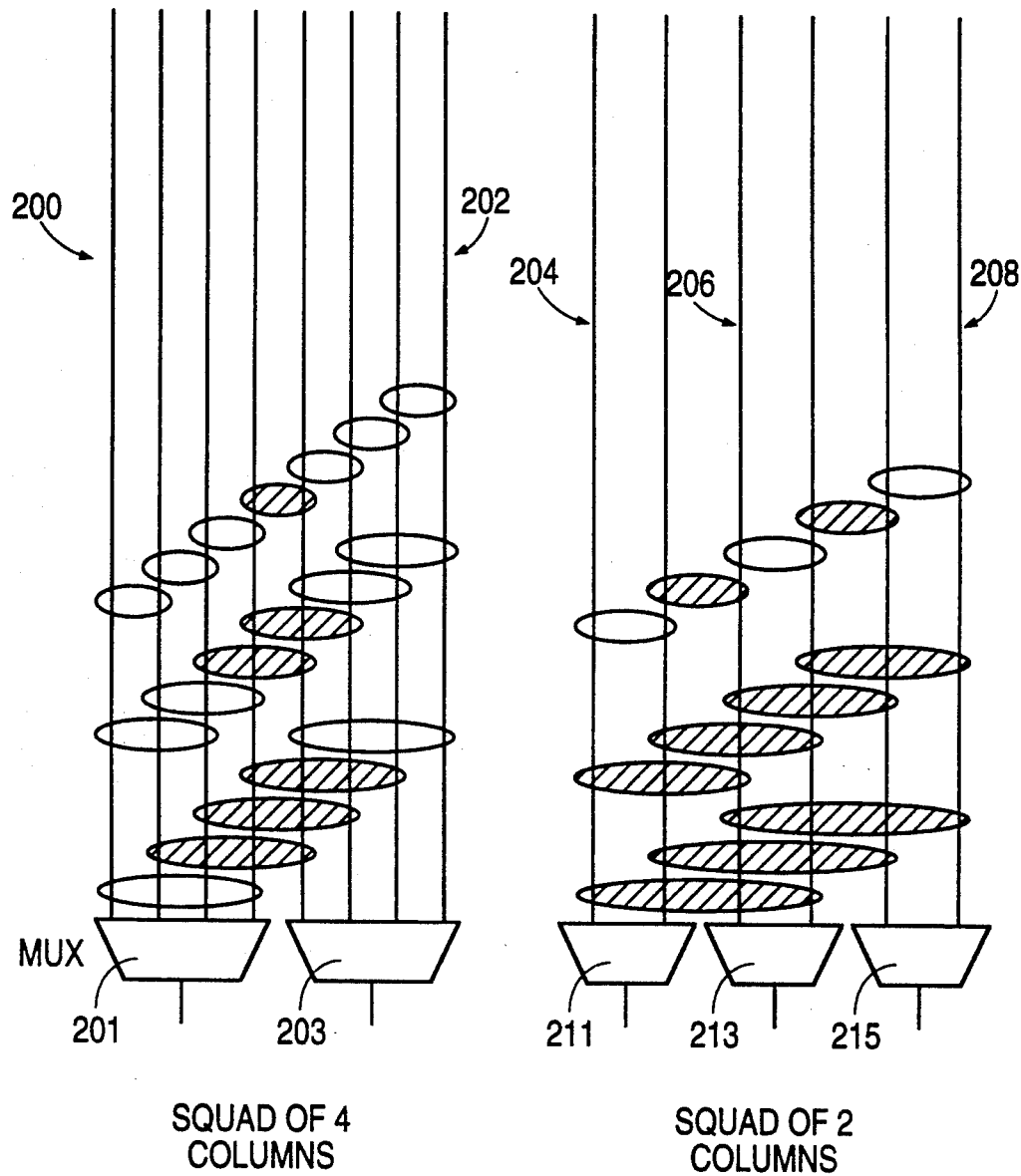
FIG. 5a shows a pair of squads, each containing four columns, and the affect of various defects thereon.
FIG. 5b shows three squads, each containing a pair of columns, and the effect of various defects thereon.

FIG. 5a shows single-sided squads 200, 202 of four columns each, as known in the prior art, each squad with a respective multiplexer (201, 203). Defects are shown capturing two, three and four adjacent columns. Note that certain defects affect columns of both squads. It will be seen that in six out of seven cases, double column defects are repairable with single-sided shift redundancy. In four out of six cases triple column defects are repairable with single sided shift redundancy. Finally, two out of four quadruple-column defects are repairable through single-sided shift redundancy.

In the case of squads 204, 206, 208 each containing two columns and its own multiplexer (211, 213, 215), as shown in FIG. 5b, defects are again shown capturing two, three and four adjacent columns. No squads can be repaired using single-sided shift redundancy for three and four column defects. Three of five defects are repairable if the defect covers two adjacent columns.

Figure 6:
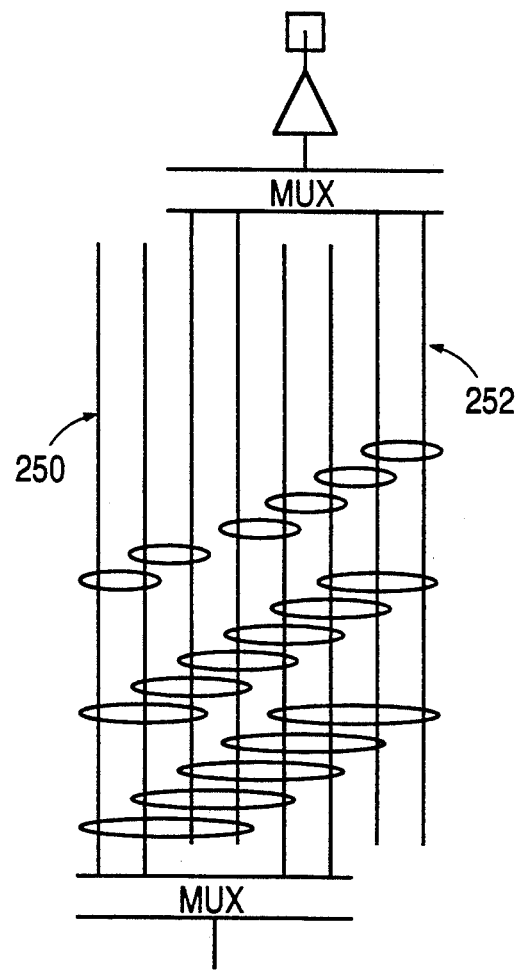
FIG. 6 shows an embodiment of the present invention having interleaved columns, and the effect of various defects thereon.

FIG. 6 shows a double-sided squad redundancy with squads 250, 252 as shown originally in FIG. 4b, with various defects capturing two, three, and four adjacent columns. Because replacement squads can be pulled in from both sides, all of the defects covering two, three and four adjacent columns can be repaired.

It will thus be seen that because of the unique layout of the present array, a high efficiency of repair of columns can be achieved.

We claim:

1. A memory device comprising:
 a first column of memory cells having a line that connects to the memory cells in the first column;
 a second column of memory cells having a line that connects to the memory cells in the second column;
 a third column of memory cells having a line that connects to the memory cells in the third column, the third column being located between the first and the second columns;
 a first multiplexer having the line of the first column and the line of the second column connected thereto and each extending therefrom; and
 a second multiplexer having the line of the third column connected thereto and extending therefrom between the first and second columns.

2. The memory device of claim 1 wherein the first and second multiplexers are on opposite ends of the columns.

3. The memory device of claim 2 and further comprising a fourth column of memory cells having a line that connects to the memory cells in the fourth column, the line of the fourth column connecting to and extending from the second multiplexer, the second column being between the third and fourth columns.

4. A memory device comprising:
 a first pair of columns of memory cells, each column in the pair having a line which connects to the memory cells in the column;
 a second pair of columns of memory cells, each column in the pair having a line which connects to the memory cells in the column;
 a third pair of columns of memory cells, each column in the pair having a line which connects to the memory cells in the column, the third pair of columns being between the first and the second pair of columns;
 a first multiplexer having the lines of the first pair of columns and the lines of the second pair of columns connected thereto and each extending therefrom;

a second multiplexer having the lines of the third pair of columns connected thereto and extending therefrom between the first and second pairs of columns.

5. The memory device of claim 4 wherein the first and second multiplexers are on opposite ends of the columns.

6. The memory device of claim 5 and further comprising a fourth pair of columns of memory cells, each column in the fourth pair having a line which connects to the memory cells in the column, the lines of the fourth column connecting to and extending from the second multiplexer, the second pair of columns being between the third and fourth pairs of columns.

* * * * *